(12) United States Patent
Vinet et al.

(10) Patent No.: US 6,551,930 B1
(45) Date of Patent: Apr. 22, 2003

(54) ETCHING AN ORGANIC MATERIAL LAYER, PARTICULARLY FOR PRODUCING INTERCONNECTIONS OF THE DAMASCENE TYPE

(75) Inventors: Françoise Vinet, Oron Oble (FR); Yves Morand, Grenoble (FR)

(73) Assignee: STMicroelectronics S.A., Gentilly (FR)

(*) Notice: Subject to any disclaimer, the term of this patent is extended or adjusted under 35 U.S.C. 154(b) by 11 days.

(21) Appl. No.: 09/589,509

(22) Filed: Jun. 7, 2000

(51) Int. Cl.[7] ............................................. H01L 21/302
(52) U.S. Cl. ....................... 438/687; 438/618; 438/624; 438/637; 438/638; 438/639; 438/640; 438/725; 438/717; 438/723; 438/724; 438/734; 430/5
(58) Field of Search ................................. 438/687, 618, 438/624, 637, 638, 639, 640, 725, 717, 723, 724, 734, 736; 430/5

(56) References Cited

U.S. PATENT DOCUMENTS 6,017,817 A * 1/2000 Chung et al. ............... 438/637
6,100,184 A * 8/2000 Zhao et al. ................. 438/638
6,150,073 A * 11/2000 Huang ........................ 430/313

OTHER PUBLICATIONS

Louis, D., et al. "Resist Removal Process in Dual Damascene Structure Integrating Cu and Silk for 0.18 μm Technology" Presented at the International Conference Micro–and–Nano–Engineering 99. Sep. 21–23, 1999.

* cited by examiner

Primary Examiner—George Goudreau
(74) Attorney, Agent, or Firm—Allen, Dyer, Doppelt, Milbrath & Gilchrist, P.A.; Lisa K. Jorgenson

(57) ABSTRACT

A method for etching an organic dielectric material layer includes depositing an inorganic barrier layer on the organic dielectric material layer, and depositing an inorganic masking layer on the inorganic barrier layer. A masking resin layer is deposited on the inorganic masking layer. The method further includes patterning the masking resin layer and etching through the inorganic masking layer to expose the inorganic barrier layer. Remaining portions of the masking resin layer are removed, and the exposed inorganic barrier layer is etched to expose the organic dielectric material layer. The method further includes removing remaining portions of the inorganic masking layer, and etching the exposed organic dielectric material layer while using the inorganic barrier layer as a mask.

16 Claims, 3 Drawing Sheets

ETCHING AN ORGANIC MATERIAL LAYER, PARTICULARLY FOR PRODUCING INTERCONNECTIONS OF THE DAMASCENE TYPE

FIELD OF THE INVENTION

The present invention relates to a process for etching an organic material layer. It also relates to a process for producing interconnections of the damascene type incorporating a polymer dielectric layer. It more particularly applies to the field of interconnections for integrated circuits using copper as the conductive material.

BACKGROUND OF THE INVENTION

A damascene structure is formed by the deposition, on one face to be connected to a microelectronic device to at least one dielectric material layer, by etching holes (for vertical interconnections) and trenches (for horizontal interconnections) in the dielectric material layer, by the deposition of a metallic layer on the etched dielectric material layer, and by polishing the metal excess in order to obtain the lines of. interconnections.

The improvement to the performance characteristics of integrated circuits (speed, low consumption) has led to a change in the materials used. To reduce the capacitance between the conductive lines, it is advantageous to use as the dielectric material certain organic materials, whose dielectric constant is lower than that of the insulating materials conventionally used, such as silicon dioxide.

The improvement to these performance characteristics is also linked to the use of a more conductive metal than the aluminum conventionally used for producing interconnection lines. The best candidate would appear to be copper, whose resistivity is twice as high as copperdoped aluminum. The use of intermediate layers has become necessary: a barrier layer with respect to the diffusion of copper, a polishing barrier layer, and a layer forming a hard mask.

The formation of the conductive lines of interconnections requires masking and etching operations with respect to the dielectric layers. When the dielectric layers were of mineral material, the removal of the masking resin caused no problem, because the removal processes did not have a detrimental influence on mineral layers. The use of organic material as the dielectric material in a damascene structure now gives rise to the problem of eliminating the masking resin without causing deterioration to the remainder of the structure and, in particular, the organic material dielectric layer.

This problem is illustrated by FIGS. 1A to 1C, which are partial cross-sectional views representing the production of a damascene type interconnection level.

FIG. 1A shows a metallic element 11 flush with the surface of a semiconductor device 10. The metallic element 11 is to be connected by a damascene type interconnection structure. A dielectric material layer 12 is first deposited on the surface of the semiconductor device. It is intended to house a conductive via permitting an electrical connection between the metallic element 11 and a connection line. On the layer 12 is deposited a layer 13 for forming a hard mask for the formation of the conductive via. The definition of the via hole is obtained by a resin mask 14 which, following the exposure and development stages, is in the form shown in FIG. 1A. The hole 15 in the resin mask 14 is aligned with the metallic element 11.

FIG. 1B shows the structure obtained after etching the layer 13 for forming the hard mask. The etching process leaves in the hard mask hole 16 with a diameter corresponding to the diameter of the hole 15 and revealing the layer 12. The following stage includes removing the resin mask. If the dielectric material layer 12 is a mineral material, this removal causes no problem. However, if the layer 12 is a polymer layer, the currently used removal methods (oxygen plasma, depolymerizing agent, solvent) give rise to a modification or consumption of the polymer. FIG. 1C shows that the removal of the resin mask has given rise to the formation of a damaged area 17 in the dielectric material layer 12.

SUMMARY OF THE INVENTION

An object of the present invention is to prevent the aforementioned problem. A first object of the invention relates to a process for etching an organic material layer. The process includes depositing an etching barrier layer on the organic material layer. The barrier layer is formed by a mineral material, i.e., an inorganic material. A masking layer is deposited on the barrier layer. The masking layer is formed by a mineral material, i.e., an inorganic material different from that of the barrier layer. A masking resin layer is deposited on the masking layer.

The process further includes forming an etching pattern in the resin layer used to expose the masking layer. The masking layer is etched in accordance with the etching pattern until the barrier layer is exposed. The masking resin layer is then removed, and the portion of the barrier layer that is exposed is etched until the organic material layer is exposed. The masking layer is removed, and the organic material layer is etched using the etched barrier layer as a mask.

Advantageously, the barrier layer etching stage and the masking layer elimination stage take place simultaneously. Optionally, following the stages of etching the barrier layer and eliminating the masking layer and before the stage of etching the organic material layer, at least one layer of a material which can be etched is deposited on the barrier layer.

A second object of the invention relates to a process for producing interconnections of the damascene type on a semiconductor device. The process includes depositing a first layer of an organic dielectric material on the surface to be connected to the semiconductor device. A second layer is deposited on the first layer. The second layer comprises a mineral material, i.e., an inorganic material, and is intended to serve as the etching barrier layer. A third layer is deposited on the second layer. The third layer comprises a mineral material, i.e., an inorganic material different from that of the second layer. A masking resin layer is deposited on the third layer.

The process further includes forming an interconnection pattern in the resin layer used to expose the third layer. The third layer is etched in accordance with the interconnection pattern until the second layer is exposed. The masking resin layer is then removed, and the portion of the second layer that is exposed is etched until the first layer is exposed. The third layer is removed, and the first layer is etched using the second layer as a mask. The etched portions are filled with an electrically conductive material.

Advantageously, the stages of etching the second layer and eliminating the third layer take place simultaneously. Preferably, the first layer is a polymer layer of very low permittivity. The second layer can be a $SiO_2$ layer. The third layer can be a $Si_3N_4$ layer.

Following the stages of etching the second layer and eliminating the third layer and prior to the stage of etching the first layer, at least one layer of a material which can be etched may be deposited on the second layer. Thus, the process can also comprise the stages of depositing a fourth layer of an organic dielectric material on the second etched layer, and depositing a fifth layer on the fourth layer. The fifth layer comprises a dielectric material and serves as a hard mask. A masking resin layer is deposited on the fifth layer. The process further includes forming an interconnection pattern in the resin layer used to expose the fifth layer. The fifth layer is etched in accordance with the interconnection pattern until the fourth layer is exposed. The masking resin layer is then removed, and the portion of the fourth layer that is exposed is etched while using the fifth layer as a mask.

In this case, the etching stage of the fourth layer and the etching stage of the first layer can take place during a single operation. The stage of eliminating the masking resin deposited on the fifth layer, the etching stage of the fourth layer and/or the etching stage of the first layer can take place simultaneously. Advantageously, the fourth layer is a very low permittivity polymer layer. The fifth layer can be a $SiO_2$ layer.

BRIEF DESCRIPTION OF THE DRAWINGS

The invention is described in greater detail hereinafter relative to non-limitative embodiments and with reference to the attached drawings, wherein.

DETAILED DESCRIPTION OF THE PREFERRED EMBODIMENTS

Figure 1A:
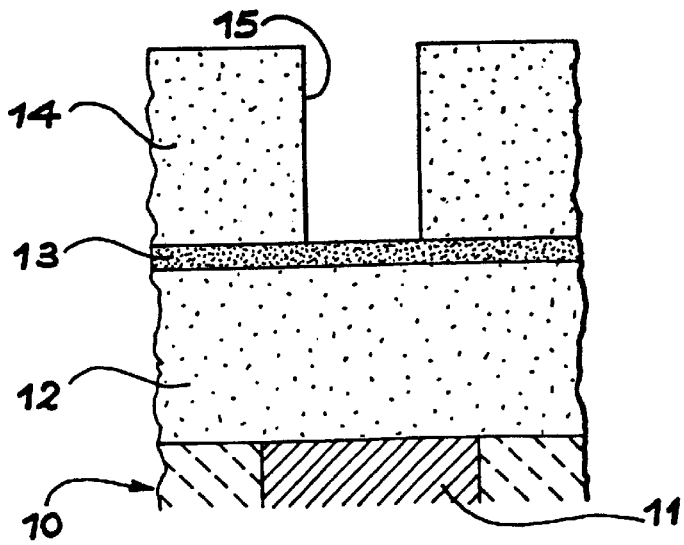
FIGS. 1A to 1C illustrate processing steps for producing an interconnection level of the damascene type according to the prior art.
Figure 1B:
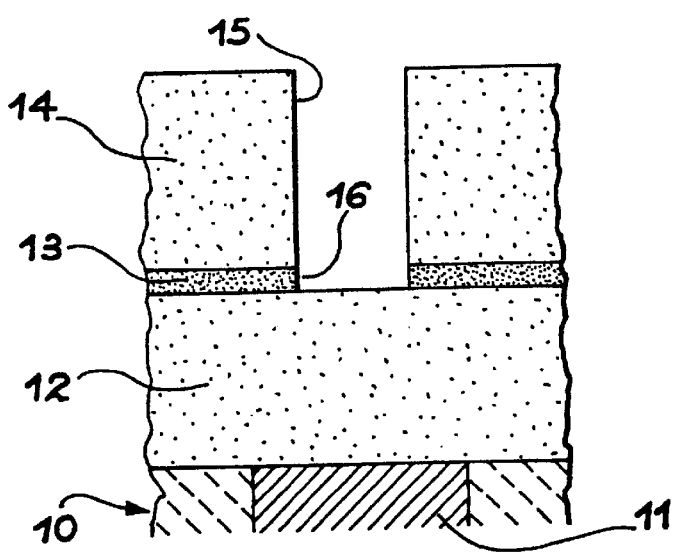
Figure 1C:
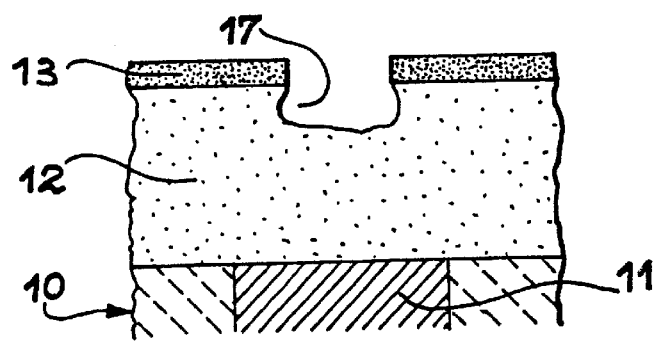
Figure 2A:
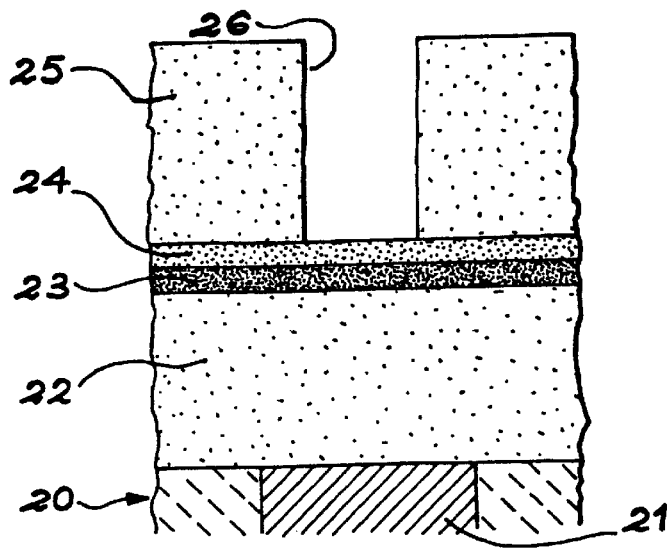
FIGS. 2A to 2F illustrate processing steps for producing an interconnection level of the damascene type according to the invention.

FIG. 2A shows a metallic element 21 flush with the surface of a semiconductor device 20. The metallic element 21 is to be connected by an interconnection structure of the damascene type. A dielectric material layer 22 formed by a very low permittivity polymer, known as a low-k polymer, is deposited on the surface of the semiconductor device. On the layer 22 are successively deposited a thin layer 23 of a mineral dielectric material, and a thin layer 24 also of a mineral dielectric material.

The layer 22 is intended to contain conductor vias in electrical contact with the metallic elements 21. The definition of the via holes is obtained by a resin mask 25 which, after the exposure and development stages, is in the form represented in FIG. 2A, which shows the formation of a single via hole. The hole 26 in the resin mask 25 is aligned with the metallic element 21.

Figure 2B:
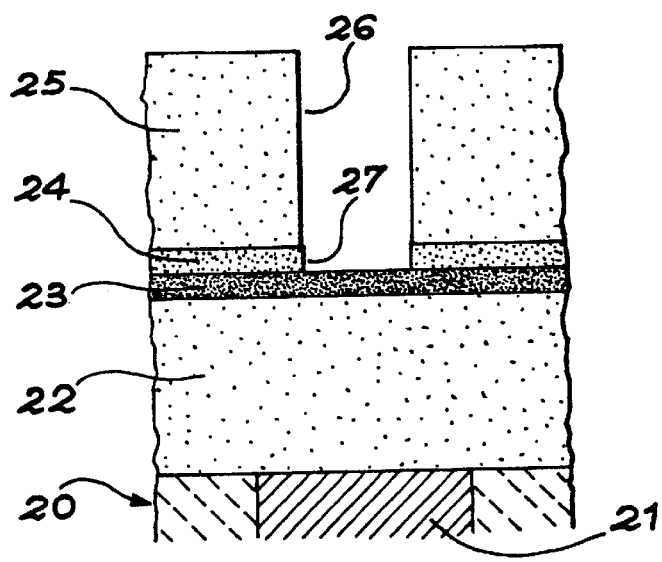

FIG. 2B shows the structure obtained after etching the layer 24. Etching leaves in the layer 24 a hole 27 with a diameter corresponding to the diameter of the hole 26, and revealing the layer 23. The layer 23 serves as a barrier layer with respect to the etching of the layer 24.

Figure 2C:
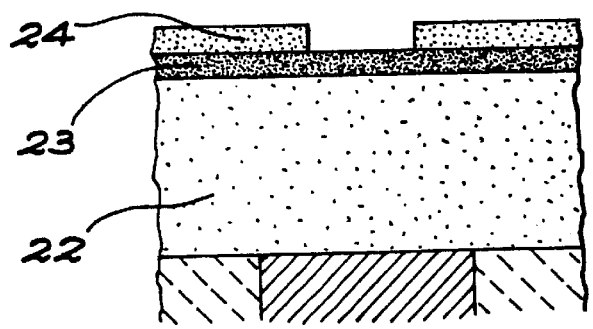

The following stage includes removing the resin mask. The organic material layer 22 is protected by the mineral material layer 23, which serves as a barrier layer with respect to effluents used during the removal of the resin. This gives the structure shown in FIG. 2C.

Figure 2D:
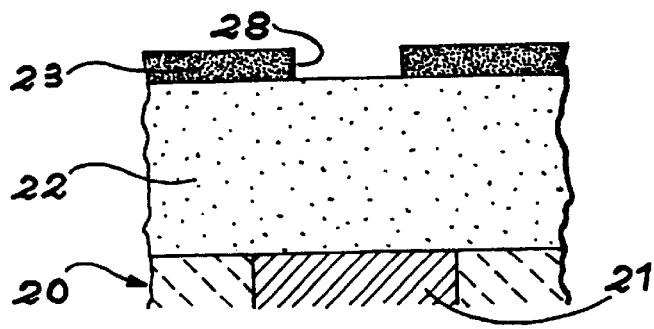

This is followed by the etching of the layer 23, with the layer 24 serving as an etching mask, and the elimination of the remaining part of the layer 24 to obtain the structure shown in FIG. 2D. The etching of the layer 23 and the elimination of the remaining part of the layer 24 can take place simultaneously. This is possible by appropriately choosing the materials of the layers 23 and 24 (e.g., $SiO_2$ for layer 23 and $Si_3N_4$ for layer 24), their respective thicknesses, the etching solution and the etching time. Thus, the layer 23 has a hole 28 aligned with each metallic element 21, and which reveals the polymer layer 22. Thus, the integrity of the polymer is preserved no matter what the size of the patterns etched in the layer 23.

Figure 2E:
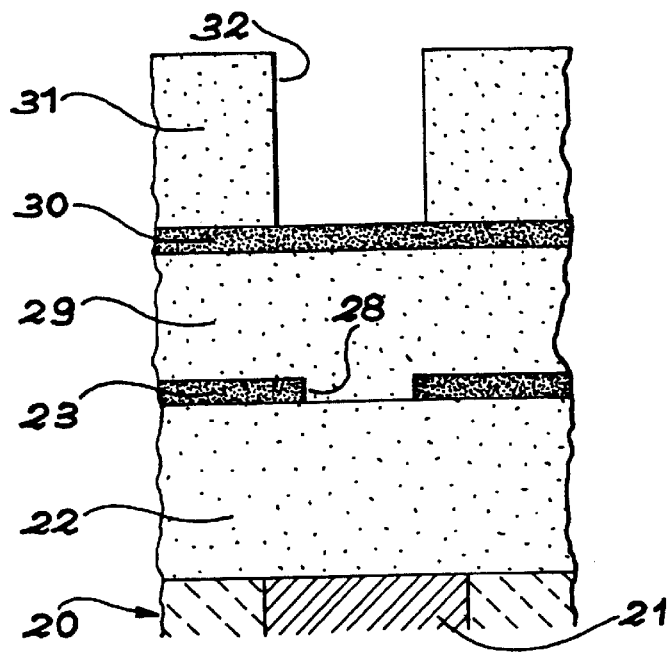

As illustrated in FIG. 2E, a dielectric material layer 29, e.g., of the same nature as the layer 22, is deposited on the previously obtained structure. The layer 29 fills the hole 28 etched in the layer 23 and comes into contact with the layer 22. A thin layer 30 to serve as a hard mask is deposited on the layer 29. The layer 30 is a mineral dielectric material layer, e.g., a $SiO_2$ layer.

The definition of the holes or trenches for housing the conductive lines in the dielectric layer 29 is obtained by a resin mask 31 which, following the exposure and development stages, is in the form shown in FIG. 2E. The hole 32 in the resin mask 31 is aligned with the metallic element 21.

Figure 2F:
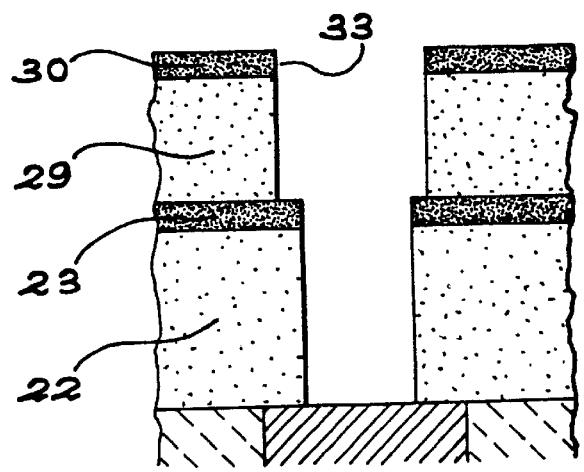

The following stage includes etching the layer 30 to obtain a hole 33 therethrough. The layer 30 can then serve as a hard mask for etching the layers 29 and 22. The resin mask 31 is eliminated during the etching of the layers 29 and 22. Thus, at this level there is no need to eliminate the resin mask by a specific treatment such as stripping, and it is also unnecessary to provide a barrier layer for this treatment. The result obtained is shown in FIG. 2F.

It is then necessary to fill using a prior art method the etched parts with a conductive material, such as copper. The operation may include depositing a copper layer and carrying out a chemical/mechanical polishing to eliminate the excess copper.

That which is claimed is:

1. A method for etching an organic dielectric material layer comprising:

forming an inorganic barrier layer on the organic dielectric material layer;

forming an inorganic masking layer on the inorganic barrier layer;

forming a masking resin layer on the inorganic masking layer;

patterning the masking resin layer and etching through the inorganic masking layer to expose the inorganic barrier layer;

removing remaining portions of the masking resin layer;

etching through the exposed inorganic barrier layer to expose the organic dielectric material layer, and removing remaining portions of the inorganic masking layer during a same operation; and etching the exposed organic dielectric material layer while using the inorganic barrier layer as a mask.

2. A method according to claim 1, wherein the inorganic masking layer is different from the inorganic barrier layer.

3. A method according to claim 1, further comprising forming at least one layer of a material on the inorganic barrier layer which can be etched, the at least one layer of the material being formed after etching the exposed inorganic barrier layer and removing remaining portions of the masking layer but prior to etching the exposed organic dielectric material layer.

4. A method according to claim 1, wherein the organic dielectric material layer comprises a polymer.

5. A method according to claim 1, wherein the inorganic barrier layer comprises $SiO_2$.

6. A method according to claim 1, wherein the inorganic masking layer comprises $Si_3N_4$.

7. A method for forming a damascene type interconnection for a semiconductor device, the method comprising:

forming a first organic dielectric material layer on a surface of the semiconductor device;

forming an inorganic barrier layer on the first organic dielectric material layer;

forming an inorganic masking layer on the inorganic barrier layer;

forming a masking resin layer on the inorganic masking layer;

patterning the masking resin layer and etching through the inorganic masking layer to expose the inorganic barrier layer;

removing remaining portions of the masking resin layer;

etching through the exposed inorganic barrier layer to expose the organic dielectric material layer, and removing remaining portions of the inorganic masking layer during a same operation;

etching the exposed first organic dielectric material layer while using the inorganic barrier layer as a mask; and filling etched portions of the first organic dielectric material layer and the inorganic barrier layer with a conductive material.

8. A method according to claim 7, wherein the first organic dielectric material layer comprises a polymer.

9. A method according to claim 7, wherein the inorganic barrier layer comprises $SiO_2$.

10. A method according to claim 7, wherein the inorganic masking layer comprises $Si_3N_4$.

11. A method according to claim 7, wherein the conductive material comprises copper.

12. A method according to claim 7, further comprising forming a second organic dielectric material layer on the inorganic barrier layer, the second organic dielectric material layer being formed after etching the inorganic barrier layer and removing remaining portions of the inorganic masking layer but prior to etching the exposed first organic dielectric material layer.

13. A method according to claim 12, wherein forming the second organic dielectric material layer further comprises:

forming a second inorganic masking layer on the second organic dielectric material layer;

forming a second masking resin layer on the second inorganic masking layer;

patterning the second masking resin layer and etching through the second inorganic masking layer to expose the second organic dielectric material layer;

removing remaining portions of the second masking resin layer; and etching through the exposed second organic dielectric material layer and through the first organic dielectric material layer to the surface of the semiconductor device while using the second inorganic masking layer as a mask.

14. A method according to claim 13, wherein etching the first and second organic dielectric material layers are performed during a same operation.

15. A method according to claim 13, wherein removing the second masking resin layer and etching the first and second organic dielectric material layers are performed during a same operation.

16. A method according to claim 13, wherein the second inorganic masking layer comprises $Si_3N_4$.

* * * * *